United States Patent [19]
Scholder et al.

[11] Patent Number: 6,118,668
[45] Date of Patent: Sep. 12, 2000

[54] COMPUTER HAVING AN EXPANSION CARD CAGE ASSEMBLY

[75] Inventors: Erica Scholder; Timothy Radloff; Karl Steffes, all of Austin; Stephen Cook, Georgetown, all of Tex.

[73] Assignee: Dell USA, L.P., Round Rock, Tex.

[21] Appl. No.: 09/129,309

[22] Filed: Aug. 5, 1998

Related U.S. Application Data

[62] Division of application No. 08/788,668, Jan. 24, 1997, Pat. No. 5,831,821.

[51] Int. Cl.⁷ .............................. H05K 5/00; H05K 7/10; H01R 13/62
[52] U.S. Cl. .................. 361/753; 361/686; 361/754; 361/759; 361/801; 439/159
[58] Field of Search .................................... 361/683–686, 361/752, 753, 759, 796, 798, 728, 732, 754, 801; 439/159, 160, 928; 364/708.1; 206/706–708; 211/41.17

[56] References Cited

U.S. PATENT DOCUMENTS

| | | | |
|---|---|---|---|
| 4,954,928 | 9/1990 | Jullien | 361/684 |
| 5,010,426 | 4/1991 | Krenz | 361/726 |
| 5,136,468 | 8/1992 | Wong et al. | 361/683 |
| 5,557,499 | 9/1996 | Reiter et al. | 361/685 |

*Primary Examiner*—Jayprakash N. Gandhi
*Attorney, Agent, or Firm*—Hanyes and Boone,LLP

[57] ABSTRACT

A computer in which an expansion card cage assembly is mounted in the computer chassis. The expansion card cage assembly includes a wall extending parallel to the chassis wall, a riser card mounted relative to the wall of the cage assembly and having a connector adapted to engage the connector of the motherboard, and at least one expansion card connected to the riser card. A lever is provided on the cage assembly wall and is adapted to engage the chassis wall to quick-detachably connect the cage assembly to the chassis.

9 Claims, 8 Drawing Sheets

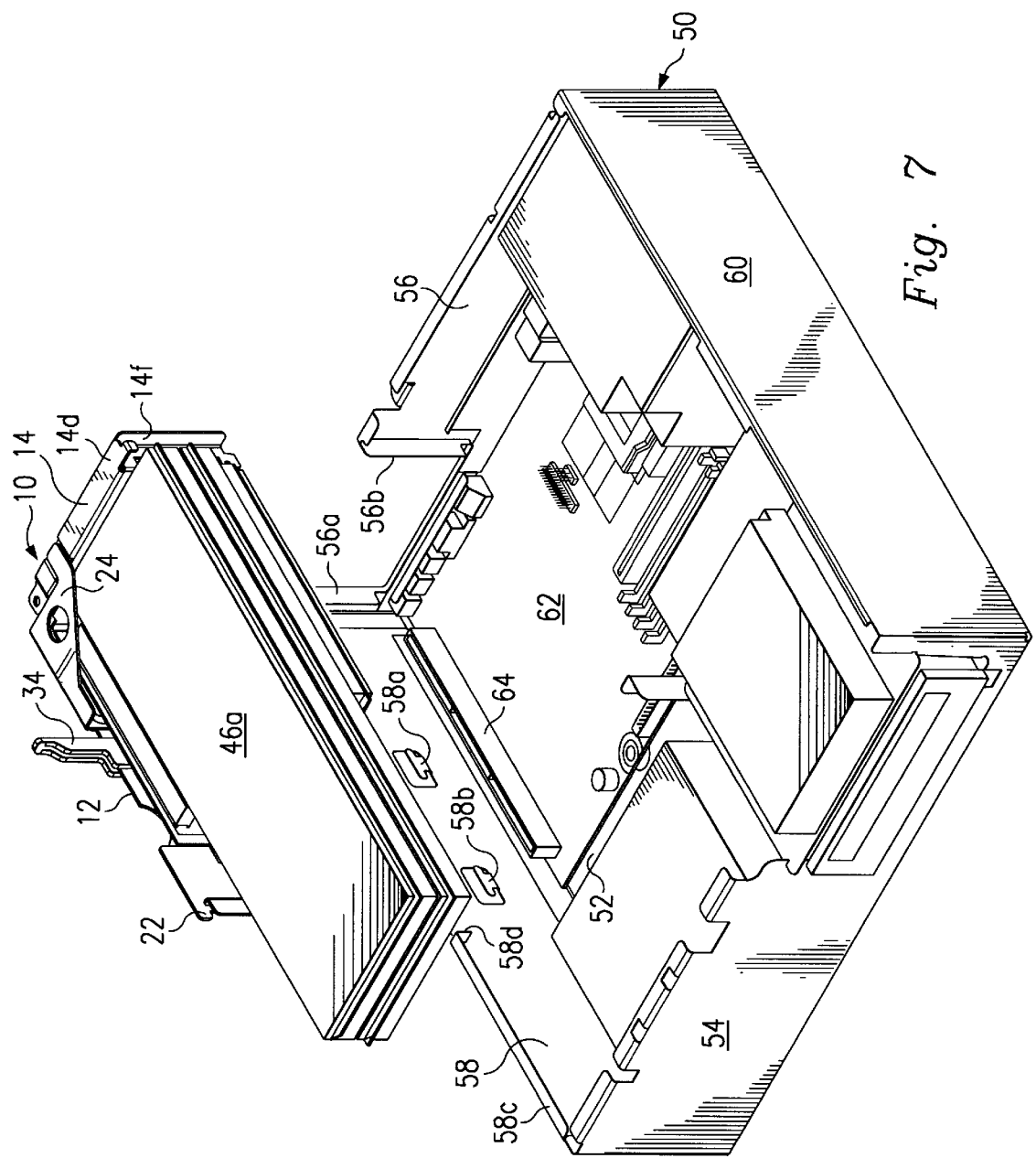

COMPUTER HAVING AN EXPANSION CARD CAGE ASSEMBLY

This application is a divisional of commonly-assigned, U.S. patent application Ser. No. 08/788,668, filed on Jan. 24, 1997, now U.S. Pat. No. 5,831,821.

TECHNICAL FIELD

An embodiment of this disclosure relates generally to the field of computers, and the like, and, more particularly, to a computer having a removable expansion card cage assembly.

BACKGROUND

Almost all desktop computers provide a number of expansion slots that allow the user to install optional cards, such as network cards, sound cards and SCSI device interface cards. According to the most commonly used methodology, connectors are provided on a riser card for receiving the expansion cards; and the riser card, in turn, plugs into a connector on the system motherboard.

There are several problems with these types of arrangements. For example, when a design goal for the computer is to make it smaller and more compact, the layout of the computer is such that the expansion cards and the riser card must often be removed to replace the expansion cards or to access other computer components. Because this often entails the use of tools, the unplugging of cables, and the removal of the expansion cards from the connectors on the riser card, it is considerably inconvenient and time-consuming.

Also, because the force required to install and remove the riser card from the connector on the system motherboard is approximately 30–45 pounds, it can cause operator or user inconvenience. Similarly, on an assembly line, long term repetitive activity of this type can cause inconvenience. Also, users are often reluctant to apply this type of brute force to their computer.

Still another problem with expansion cards and associated components of this type is that, unless there is a good alignment strategy for the mating of their respective connectors, the connectors can easily be damaged during their installation and removal, both on the assembly line and by the user or service technician.

Therefore what is needed is an expansion card cage assembly that is easily removable from the computer as a single unit with a minimum of force without using any tools or removing any other components in the computer. Also, what is needed is an assembly of the above type in which the assembly can be removed and installed in the above manner while maintaining a good alignment strategy.

SUMMARY

According to an embodiment of the computer of the present disclosure, an expansion card cage assembly is provided which has a wall extending parallel to the wall of the chassis of the computer. At least one expansion card is mounted relative to the cage assembly wall, and a lever is pivotally mounted on the cage assembly wall and adapted to engage the chassis wall to quick-detachably connect the cage assembly to the chassis.

Several advantages are achieved by the above. For example, the expansion card cage assembly of the present invention can easily be removed from the computer as a single unit with a minimum of force without using any tools or removing any expansion cards that may be installed. Also, the assembly of the present invention can be removed and installed in the above manner while maintaining a good alignment strategy.

BRIEF DESCRIPTION OF THE DRAWINGS

FIG. 6 is a view similar to FIG. 5 but showing expansion cards installed in the cage assembly.

FIG. 7 is an isometric view, on reduced scale, from the front of a the chassis of the computer of FIG. 1, depicting the cage assembly and expansion cards of FIG. 5 positioned above the chassis.

DETAILED DESCRIPTION OF THE PREFERRED EMBODIMENT

Figure 1:
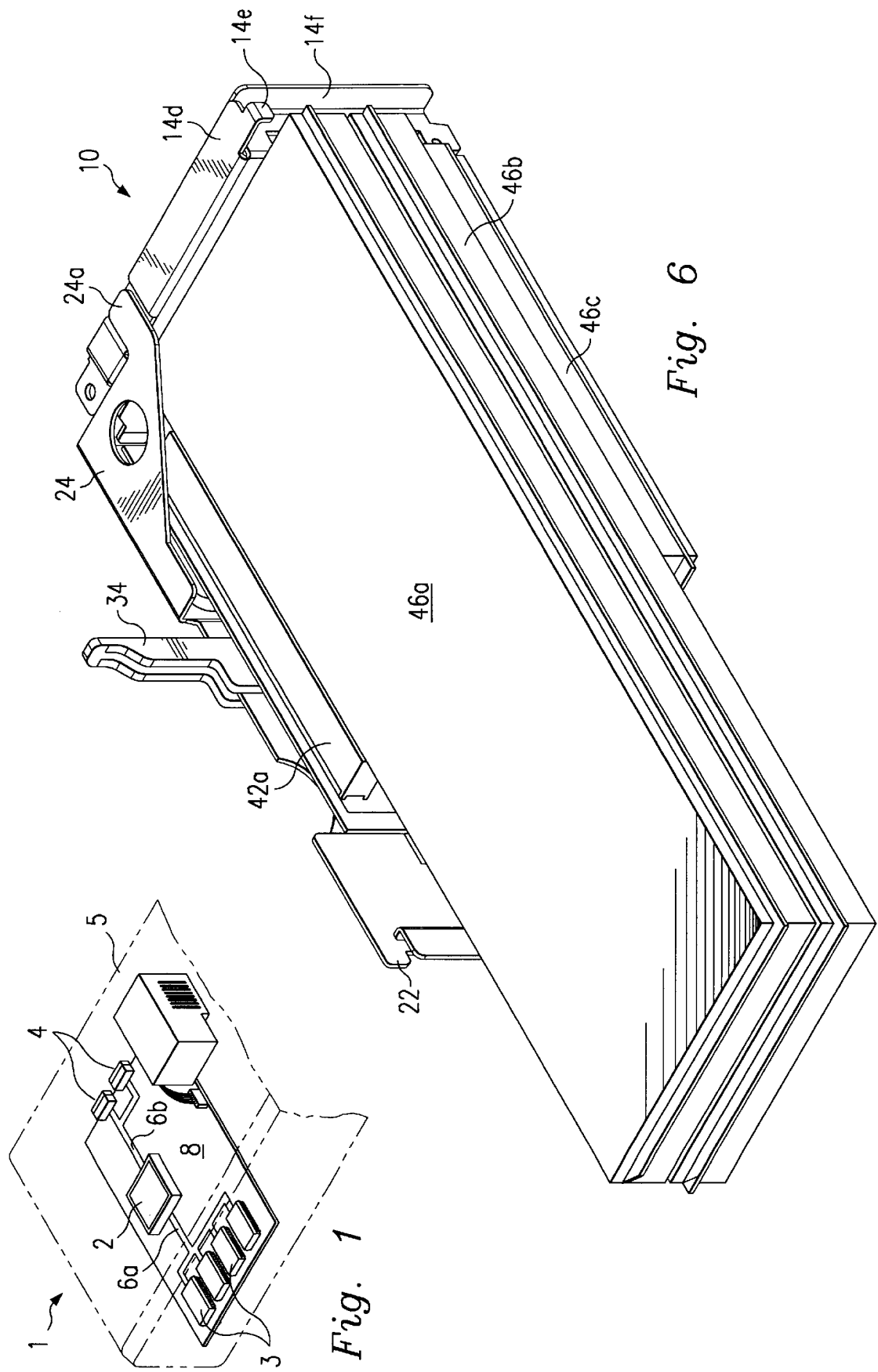
FIG. 1 is a schematic view of the computer according to an embodiment of the present disclosure.

The personal computer according to an embodiment of the present disclosure is referred to, in general by the reference numeral 1 in FIG. 1 of the drawings, and may be in the form of a desktop computer, a laptop computer or a tower computer. The personal computer 1 includes a processor 2, a memory device 3, and two input/output (I/O) devices 4, all contained within a chassis 5. Two busses 6a and 6b connect the processor 2 to the memory 3 and to the input/output devices 4, respectively, it being understood that other electrical traces (not shown) are provided for connecting the components of the computer 1. A mother board 8 is also contained in the chassis 5 for mounting and interconnecting various electrical circuits and related devices. Because the computer shown in FIG. 1 is conventional, it will not be described in any further detail.

Figure 2:
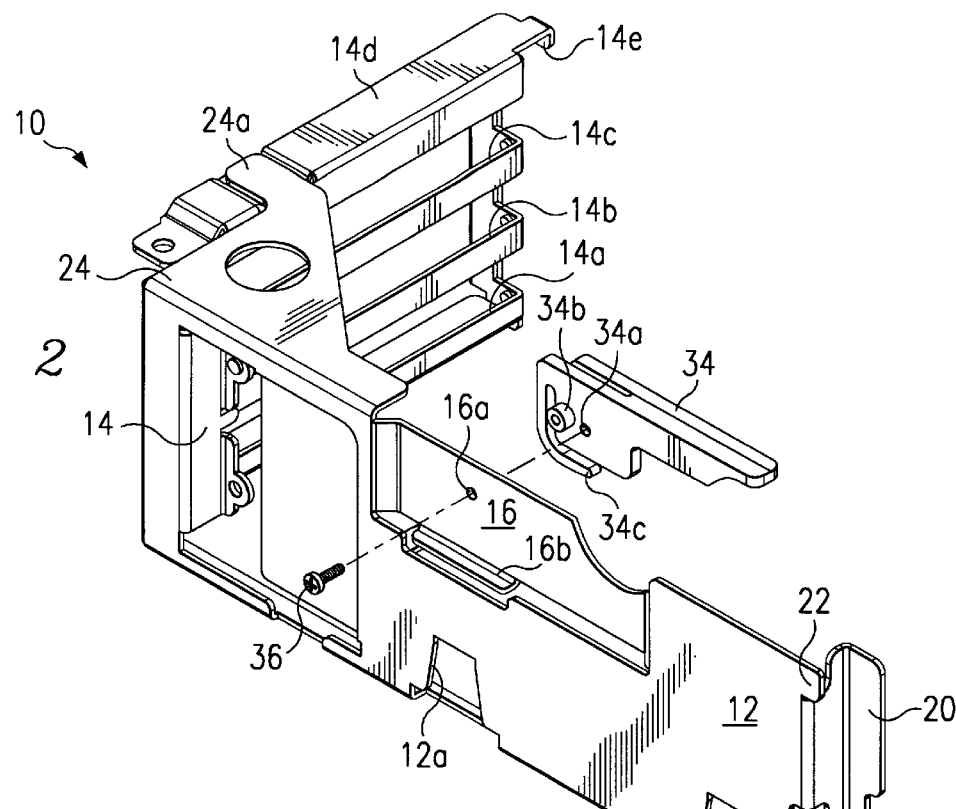
FIG. 2 is a front, exploded, enlarged isometric view of the expansion card cage assembly utilized in the computer of FIG. 1.
Figure 3:
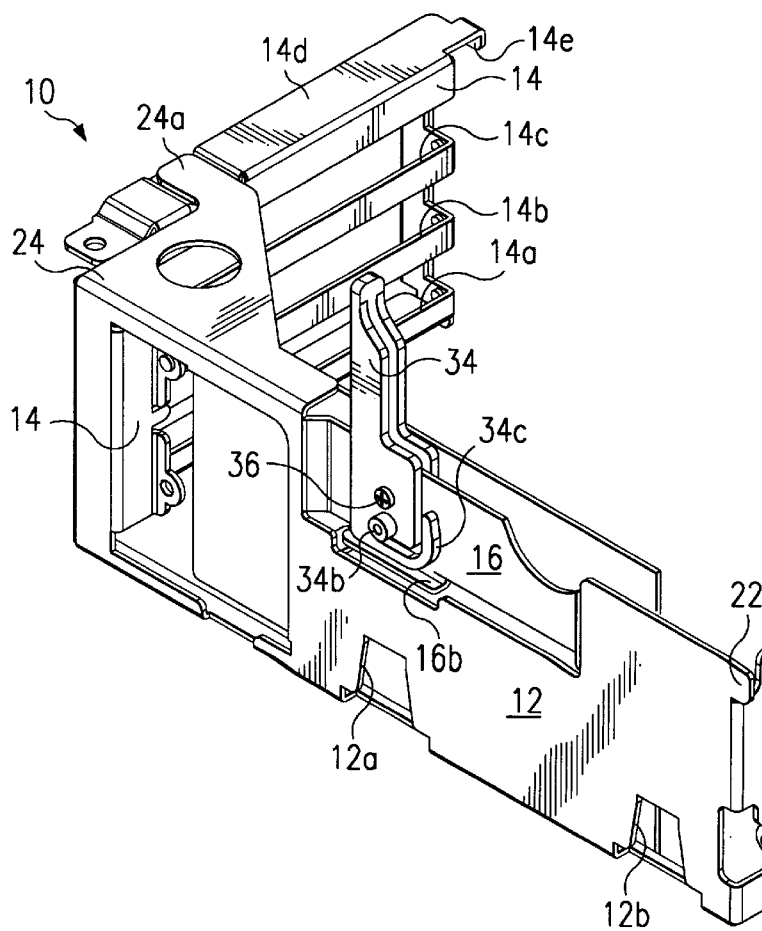
FIG. 3 is a view similar to FIG. 2 but depicting the cage assembly fully assembled with its actuating lever in an unlocked position.

Referring to FIGS. 2 and 3 of the drawings, the reference numeral 10 refers, in general, to the expansion card cage assembly of the present disclosure which is adapted to be mounted on the chassis 5. The cage assembly 10 is formed by two upright walls 12 and 14 extending at right angles to each other. The walls 12 and 14 are preferably formed from a single plate of sheet metal which is bent at a right angle.

The wall 12 is configured to define a recessed portion 16 extending slightly inwardly from the plane of the wall and having a through opening 16a. A horizontally-extending tab 16b extends outwardly from the recessed wall 16 and two spaced slots 12a and 12b are formed in the lower portion of the wall 12. The distal end of the wall 12 is bent to from a flange 20, and a tab 22 extends from the upper edge of the latter end of the wall 22.

A horizontally-extending tab 24 extends diagonally from the wall 12 to the wall 14. The wall 14 has three horizontally-extending elongated slots 14a–14c extending therethrough, it being understood that this number can vary depending on the particular requirements. The wall 14 also has a horizontally-extending upper portion 14d which is formed by bending the upper portion of the wall 14. An arm 24a extends outwardly from the tab 24 and is secured, in any conventional manner, to the upper wall portion 14d. An end of the upper wall portion 14d is bent downwardly to form a tab 14e.

An actuating lever 34, preferably formed of plastic, is pivotally attached to the recessed wall portion 16 by a screw 36, or any other fastening device, that extends through the opening 16a and through a corresponding opening 34a extending through the lever. A post 34b is formed on the lever 34 and extends outwardly from the plane of the wall 12 and an arcuate slot is formed through the lever 34 that defines an arcuate spring portion 34c. The lever 34 is depicted in its upright, unlocked position in FIG. 3 in which the spring portion 34c of the lever 34 engages the tab 16b, creating a spring tension that maintains the lever in the unlocked position. The lever 34 is pivotal from the unlocked position of FIG. 3 to a locked position shown in FIG. 4 in which it extends substantially horizontally. In the latter position the post 34b engages a wall of the above-mentioned computer chassis (not shown in FIG. 4) in a manner that will be described.

Figure 5:
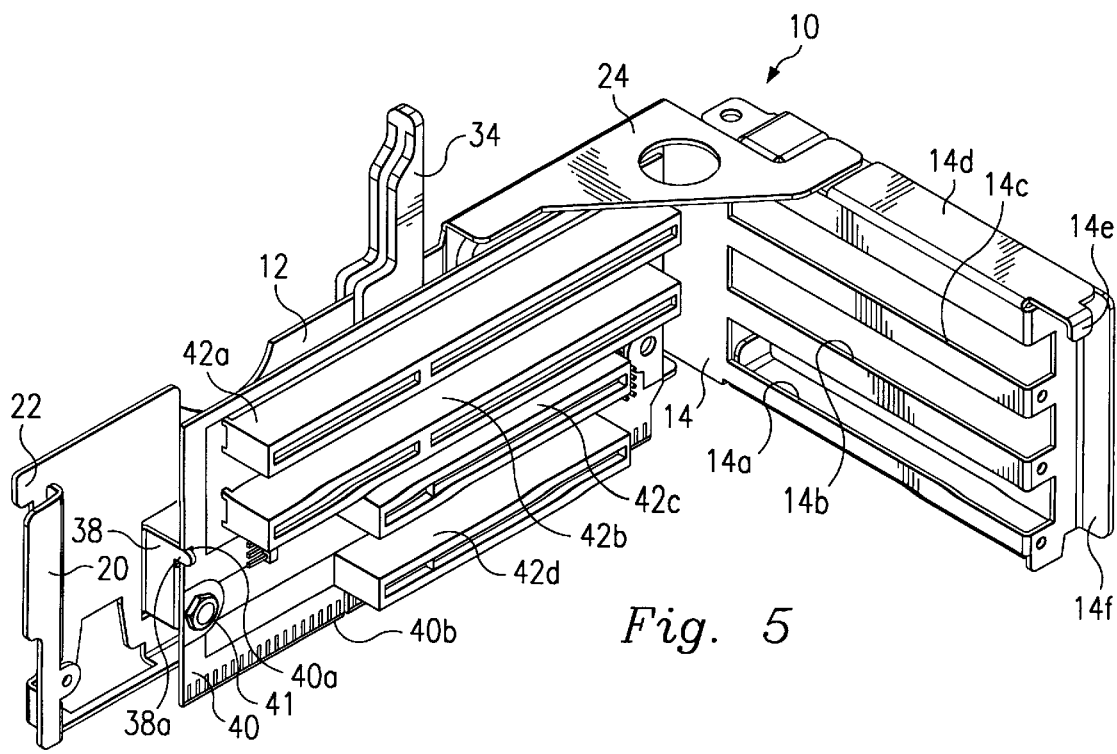
FIG. 5 is a rear isometric view of the cage assembly of FIG. 4.

Referring to FIG. 5, the distal end portion of the wall 14 is bent in two planes to form a portion 14f extending parallel to the wall 14. A pair of mounting flanges, one of which is shown by the reference numeral 38, extends from the inner portion of the wall 12 and can be formed integrally with the wall 12 or can be fastened thereto in any conventional manner. A vertically-extending riser card 40 extends parallel to, and slightly spaced from, the wall 12 in engagement with the flange 38. A tab 38a is formed on each flange 38 and extends in a notch 40a provided at one end of the riser card 40. A fastener 41 extends through an opening in the card 40 and through an aligned opening in the flange 38 to secure the card to the flange. It is understood that the other end of the card 40 engages a flange and a tab identical to the flange 38 and the tab 38a and is fastened to the latter flange in an identical manner.

The riser card 40 has a standard edge connector 40b on its lower edge portion, as viewed in FIG. 5, which is adapted to engage in a slot formed in a connector on a motherboard (not shown in FIG. 5), in a manner to be described. Four vertically-spaced expansion card connectors 42a–42d are mounted on the riser card 40 and project inwardly. The connectors 42a and 42b each have two slots for receiving expansion cards, and the connectors 42c and 42d have one slot for the same purpose, as will be explained.

As shown in FIG. 6, three expansion cards 46a–46c are mounted on the cage assembly 10 and can be in the form of network cards, sound cards and/or SCSI device interface cards. To this end, it is understood that a plurality of standard edge connectors (not shown) are provided on the respective inner edges of the cards 46a–46c which extend in three of the slots in the connectors 42a–42d. The rear end portions of the expansion cards 46a–46c are accessible via the slots 14a–14c in the wall 14 to enable cables, connectors or the like to be plugged into appropriate slots, jacks, or the like (not shown) provided on the corresponding ends of the cards.

FIG. 7 depicts the cage assembly 10, including the expansion cards 46a–46c, positioned above the chassis 5 (shown generally in FIG. 1). The chassis 5 includes a bottom wall, or floor, 52, a front wall 54, a rear wall 56 and two sidewalls 58 and 60, all of which extend perpendicular to the bottom wall 52. A rectangular opening 56a is provided in the rear wall 56 which substantially corresponds, in width and height, to the wall 14 of the cage assembly 10. A portion 56b of the wall 56 adjacent the opening 56a is bent inwardly and extends at right angles to the wall 56 to guide the cage assembly 10 into the chassis 5 during assembly, as will be described.

Figure 4:
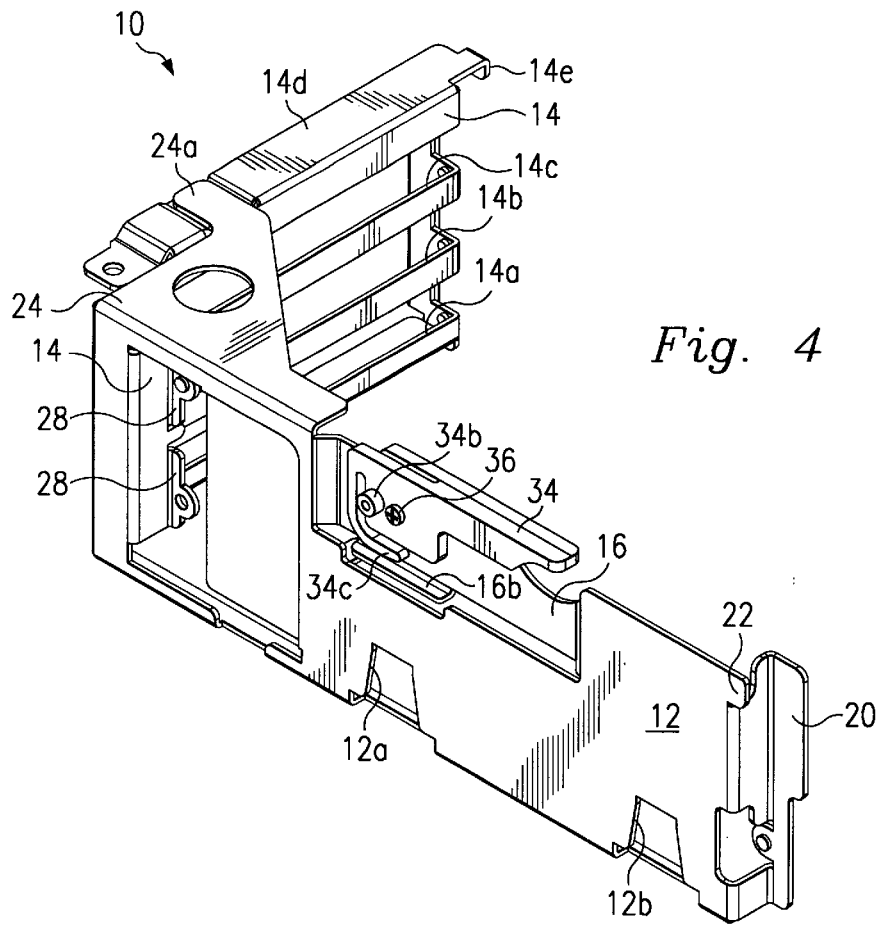
FIG. 4 is a view similar to FIG. 3 but depicting the cage assembly with the actuating lever in a locked position.

Two horizontally spaced, inwardly-extending hooks 58a and 58b are formed on the wall 58 and extend inwardly from the plane of the wall for engaging the slots 12a and 12b, see also FIG. 4, of the cage assembly 10 in the assembled position of the assembly. An extended upper portion 58c of the wall 58 is bent inwardly to extend at right angles to the latter wall. The inner end portion of the upper bent portion 58c is bent downwardly to form a tab 58d for guiding the cage assembly 10 into the chassis 5 during assembly.

The motherboard 8 (shown generally in FIG. 1) is provided on the bottom wall 52 of the chassis 5 and a connector 64 extends upwardly from the motherboard for receiving the edge connector 40b (not shown in FIG. 7) of the riser card 40 as will be shown and described. Components of the computer 1 shown in FIG. 1, as well as other standard components, are located in the chassis 5 but will not be described because they do not form any part of the present invention. It is understood that the chassis 5 is fabricated from sheet metal and forms an inner housing for the computer 1, and that an outer housing (not shown), preferably of plastic, is placed over the chassis 5 to form a complete assembly.

Figure 8:
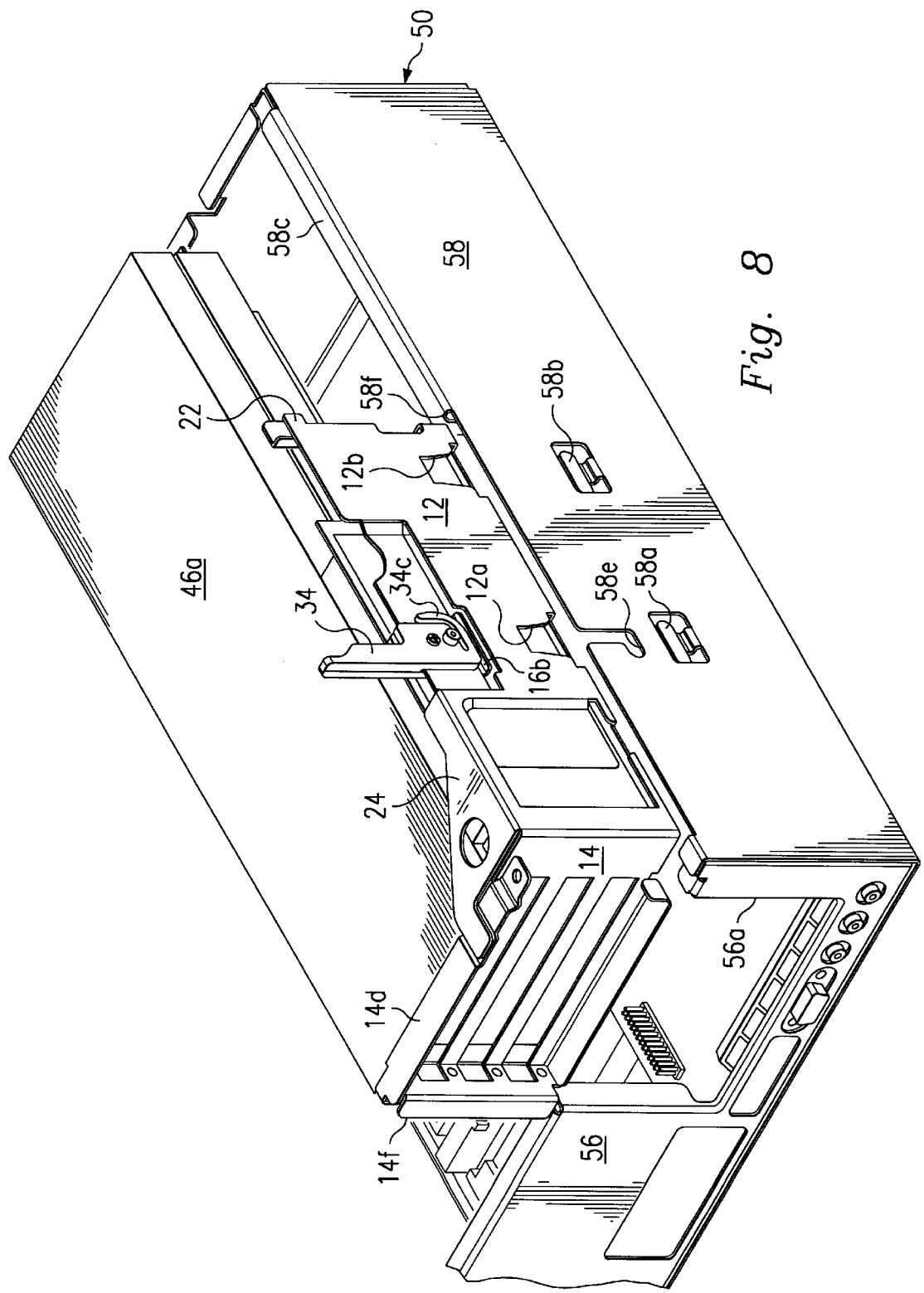
FIG. 8 is a partial isometric view from the rear of the chassis of FIG. 7, depicting the cage assembly immediately prior to installation on the chassis.
Figure 9:
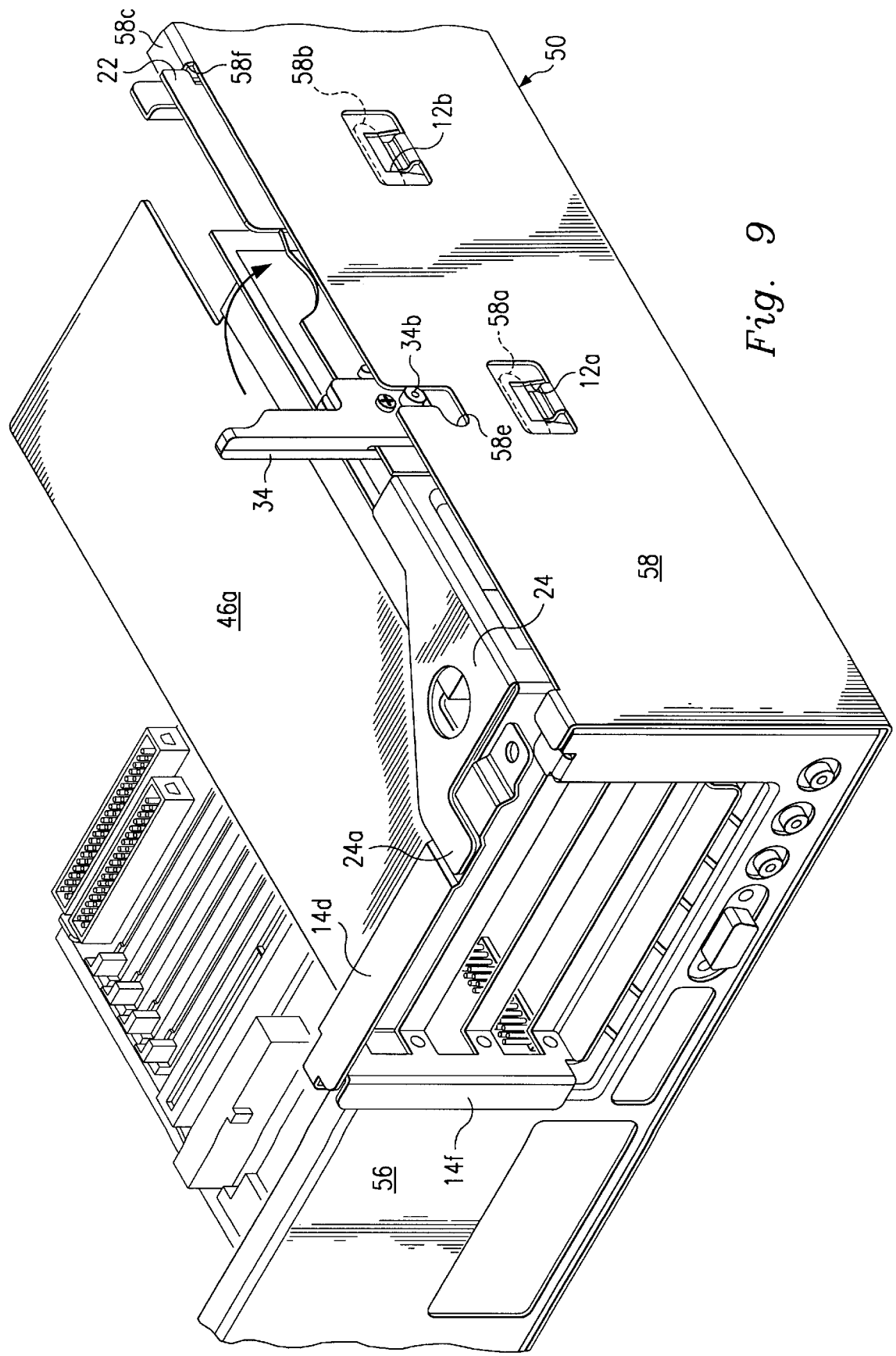
FIG. 9 is a view similar to FIG. 8, but depicting the cage assembly installed on the chassis with its actuating lever in its unlocked position.

As shown in FIG. 8, an L-shaped slot 58e is formed in the upper portion of the chassis wall 58 which receives the post 34b of the lever 34 in a manner to be described. The slot 58e has a vertical portion extending from the upper edge of the wall 58 and a horizontal portion extending from the vertical portion. As shown in FIG. 9, a slot 58f is also formed in the end of the wall portion 58 for reasons to be described.

To assemble the cage assembly 10 to the chassis 5, the cage assembly is positioned above the chassis with the walls 12 and the flange 14f of the assembly aligned with the walls 58 and 56, respectively, of the chassis, as shown in FIG. 8. The slots 12a and 12b in the wall 12 are also aligned with the hooks 58a and 58b, respectively, of the wall 58, and the lever 34 is placed in its upright, unlocked position.

Figure 10:
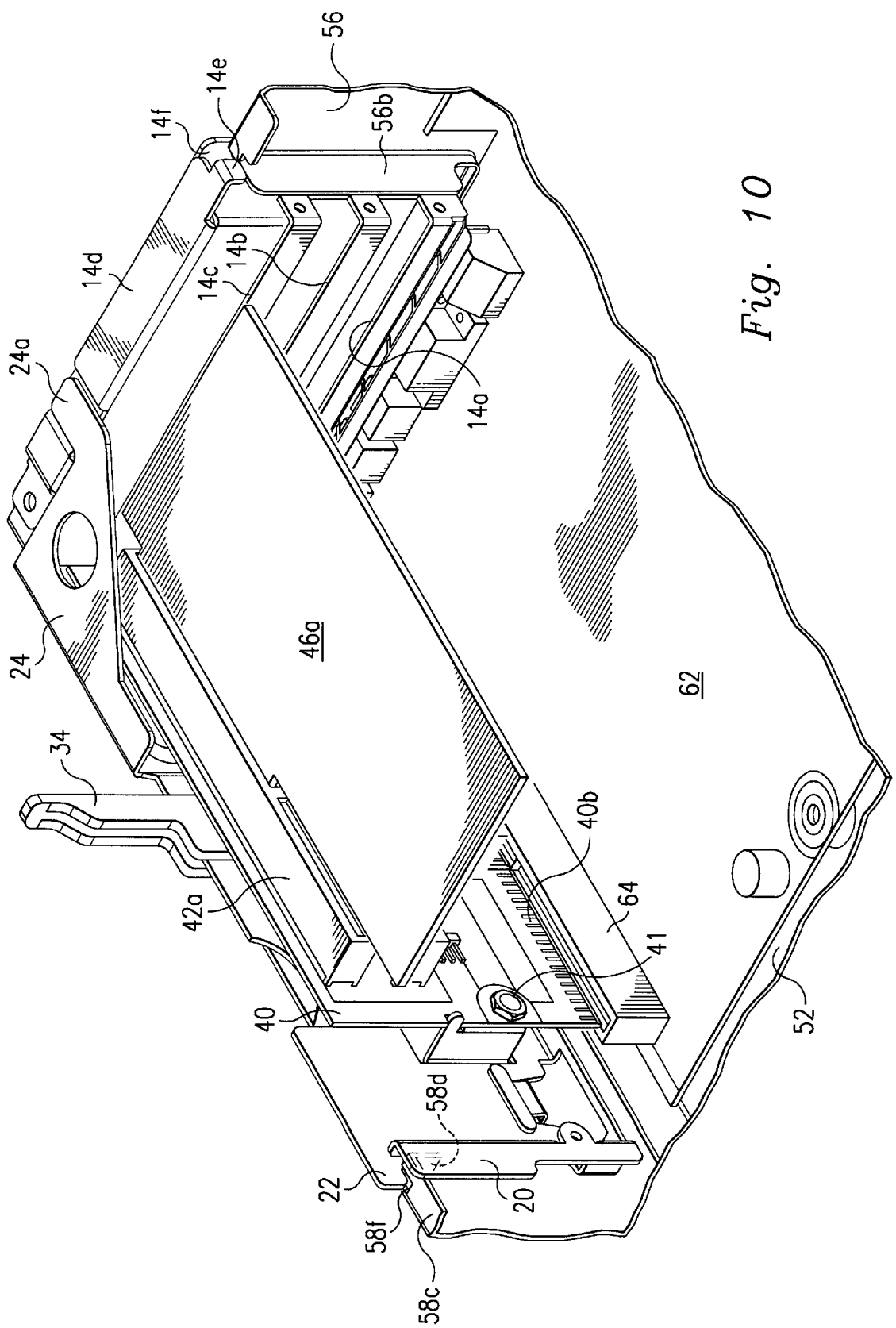
FIG. 10 is a view similar to FIG. 9 but from the inside of the chassis.

The cage assembly 10 is then lowered relative to the chassis 5 to the assembled position of FIGS. 9 and 10, with the wall portion 56b and the hooks 58a, 58b and tab 58d guiding this movement. In the assembled position, the slots 12a and 12b of the wall 12 of the cage assembly 10 extend over the hooks 58a and 58b of the chassis wall 58. Also, as better shown in FIG. 10, the tab 22 of the cage assembly 10 extends in the slot 58f in the chassis 5, and the flange 20 of the cage assembly extends over the end of the wall portion 58c of the chassis. Further, the tab 14e of the cage assembly 10 extends over the wall portion 56b of the chassis 5. As better shown in FIG. 9, the tab 14e of the wall 14 extends over a portion 56b of the wall 56. The cage assembly 10 is thus precisely located in the chassis 5.

During the lowering of the cage assembly 10 into the chassis 5 as described above, the lever 34 is retained in its upright, unlocked position by the engagement of the spring portion 34c with the tab 16b as described above. Therefore, during this movement the post 34b of the lever 34 extends in the vertical portion of the slot 58e, as shown in FIG. 8.

As shown in FIG. 10, in the assembled position of the cage assembly 10, the edge connector 40b of the riser card 40 extends in the motherboard connector 64 in the chassis 5 to complete the connections between the expansion cards 40a–40d and the motherboard 8. (The expansion cards 46b–46d are not shown in FIG. 10 to better show this connection.)

Figure 11:
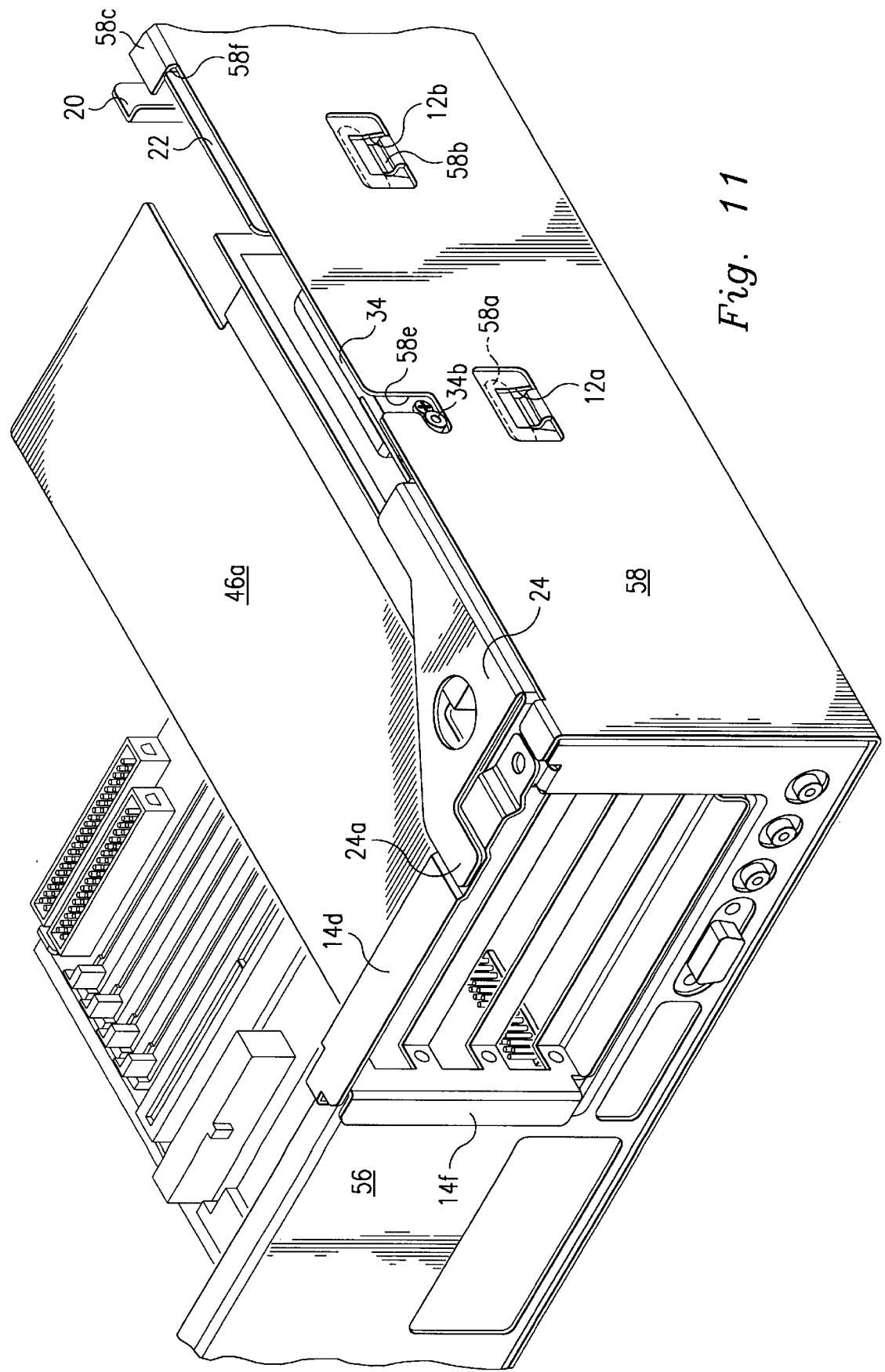
FIG. 11 is a view similar to FIG. 9 but depicting the cage assembly installed on the chassis with the actuating lever in its locked position.

To lock the cage assembly 10 in its assembled position relative to the chassis 5, the lever 34 is pivoted from its upright, unlocked position shown in FIGS. 8 and 9 to a locked position shown in FIG. 11. During this locking pivotal movement of the lever 34 from its unlocked position to its locked position, the riser card 40 is forced into the connector 64 and the post 34b on the lever 34 slides from the vertical portion of the slot 58e to the horizontal portion of the slot which secures the cage assembly 10 against any vertical movement relative to the chassis 5.

Thus the cage assembly 10 is quick-detachably connected to the chassis 5 in a manner to permit it to be easily and quickly installed to, and removed from, the chassis 5 with minimum force without using any tools. Also, when the lever 34 moves from its unlocked position to its locked position as described, it acts as a mechanical lever to reduce the force required to install the riser card 40 in the connector 64. Further, the expansion cards 46a–46c can be removed from the chassis 5 and replaced or repaired without disturbing any of the other components in the chassis. Further, the cage assembly 10 can be removed from and installed in the chassis in the above manner while maintaining a good alignment strategy with repect to the connections between the riser card 40 and the motherboard 8, and between the expansion cards 46a–46c and the riser card 40.

It is understood that the embodiment of the assembly of the present invention described above is intended to illustrate rather than limit the disclosure, and that the assembly of the present invention can take many other forms and embodiments within the scope of the disclosure. For example, the number of connectors, slots, expansion cards and tabs can vary within the scope of the disclosure.

What is claimed is:

1. An assembly for installation in a computer chassis comprising:
   at least one upright chassis wall including a slot formed therein;
   a cage assembly having a first cage assembly wall extending parallel to the chassis wall;
   at least one expansion card mounted to the first cage assembly wall;
   a lever pivotally mounted in the first cage assembly wall engaging the chassis wall to quick-detachably connect the cage assembly to the chassis; and
   a post formed on the lever and extending in the slot formed in the chassis wall.

2. The cage assembly of claim 1 wherein the cage assembly further comprises an additional wall extending perpendicular to the first-mentioned cage assembly wall and having a plurality of slots formed therein, and wherein the chassis has an additional wall extending perpendicular to its first-mentioned chassis wall and having an opening extending therethrough, the additional wall of the cage assembly extending in the opening in the additional chassis wall so that the slots in the additional wall of the cage assembly permit access to the expansion cards.

3. The cage assembly of claim 1 further comprising hooks formed on the cage assembly wall for engaging mated slots formed in the chassis wall.

4. The cage assembly of claim 1 further comprising a tab formed on the cage assembly and adapted to engage a mated slot formed on the chassis.

5. The cage assembly of claim 1 further comprising a riser card extending parallel to the cage assembly wall, a first connector mounted on the riser board for engaging a connector on a motherboard in the chassis, and a second connector connected to the riser board for receiving an expansion card.

6. An assembly for installation into a computer chassis comprising:
   a cage assembly mounted in the chassis, the chassis having a slot formed therein;
   an expansion card mounted in the cage assembly;
   a lever pivotally mounted on the cage assembly engaging the chassis to quick-detachably connect the cage assembly to the chassis; and
   a post formed on the lever and extending into the slot formed in the chassis.

7. A method of installing an expansion card in a computer chassis having an upright wall comprising the steps of:
   providing a card cage;
   mounting the expansion card relative to a cage wall;
   providing a lever on the cage wall;
   inserting the cage wall and therefore the expansion card in the chassis;
   pivoting the lever into engagement with the upright wall of the chassis to quick-detachably connect the expansion card to the chassis; and
   providing a slot in the upright chassis wall which is engaged by the lever.

8. The method of claim 7 wherein the expansion card is connected to a riser card attached to the cage wall and wherein, during the step of pivoting, the lever forces the riser card into engagement with a motherboard connector on the chassis.

9. A method of installing an expansion card in a computer chassis comprising the steps of:
   providing a cage assembly;
   mounting the expansion card relative to the cage assembly;
   providing a lever including a post on the cage assembly;
   inserting the cage assembly including the expansion card in the chassis;
   pivoting the lever into engagement with the chassis to quick-detachably connect the expansion card to the chassis; and
   providing a slot in the chassis which is engaged by the post of the lever.

* * * * *